(12) United States Patent
Chen

(10) Patent No.: US 11,120,729 B1
(45) Date of Patent: Sep. 14, 2021

(54) SHIFT REGISTER, DRIVING METHOD THEREOF, GATE DRIVING CIRCUIT AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Peng Chen, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 416 days.

(21) Appl. No.: 16/094,249

(22) PCT Filed: Mar. 21, 2018

(86) PCT No.: PCT/CN2018/079815
§ 371 (c)(1),
(2) Date: Oct. 17, 2018

(87) PCT Pub. No.: WO2018/201815
PCT Pub. Date: Nov. 8, 2018

(30) Foreign Application Priority Data

May 4, 2017 (CN) .......................... 201710308386.6

(51) Int. Cl.
*G09G 3/20* (2006.01)
(52) U.S. Cl.
CPC ... *G09G 3/2092* (2013.01); *G09G 2300/0426* (2013.01); *G09G 2310/027* (2013.01);
(Continued)

(58) Field of Classification Search
CPC .......... G09G 3/2092; G09G 2310/027; G09G 2300/0426; G09G 2310/08; G09G 2310/061; G09G 2310/0286
See application file for complete search history.

(56) References Cited

U.S. PATENT DOCUMENTS

2014/0086379 A1  3/2014  Ma et al.
2015/0280704 A1  10/2015 Wu et al.
(Continued)

FOREIGN PATENT DOCUMENTS

CN  102654986 A  9/2012
CN  102968950 A  3/2013
(Continued)

OTHER PUBLICATIONS

First Office Action for Chinese Patent Application No. 201710308386.6 dated Jan. 11, 2019.
(Continued)

*Primary Examiner* — Andrew Sasinowski
(74) *Attorney, Agent, or Firm* — Calfee, Halter & Griswold LLP

(57) ABSTRACT

A shift register includes a node control circuit configured to set a potential at a first node under control of an input signal, a reset signal, and a potential at a second node, and to set the potential at the second node under control of a second clock signal and the potential at the first node. Also included is an output circuit and a threshold voltage control circuit configured. The output circuit includes a de-noising transistor to achieve a balance between a gate voltage and a source voltage of the de-noising transistor during a time interval.

20 Claims, 6 Drawing Sheets

(52) U.S. Cl.
CPC ............... *G09G 2310/0286* (2013.01); *G09G 2310/061* (2013.01); *G09G 2310/08* (2013.01)

(56) References Cited

U.S. PATENT DOCUMENTS

| | | |
|---|---|---|
| 2016/0012911 A1 | 1/2016 | Han et al. |
| 2016/0027527 A1 | 1/2016 | Murakami et al. |
| 2016/0125954 A1 | 5/2016 | Gu |
| 2018/0108426 A1 | 4/2018 | Zheng et al. |
| 2018/0122315 A1* | 5/2018 | Zhang .................. G09G 3/3611 |
| 2018/0275804 A1* | 9/2018 | Huang ................ G06F 3/04184 |
| 2018/0293924 A1 | 10/2018 | Wang |
| 2018/0301200 A1 | 10/2018 | Shang et al. |
| 2018/0335814 A1 | 11/2018 | Shao et al. |
| 2019/0012970 A1 | 1/2019 | Chen et al. |
| 2019/0318796 A1* | 10/2019 | Xiong .................. G09G 3/3677 |
| 2020/0066201 A1* | 2/2020 | Shang Guan ........ G09G 3/3681 |
| 2020/0075113 A1* | 3/2020 | Yuan .................... G11C 19/287 |

FOREIGN PATENT DOCUMENTS

| | | |
|---|---|---|
| CN | 103208263 A | 7/2013 |
| CN | 103295511 A | 9/2013 |
| CN | 103761937 A | 4/2014 |
| CN | 104332126 A | 2/2015 |
| CN | 104332181 A | 2/2015 |
| CN | 105051826 A | 11/2015 |
| CN | 105528985 A | 4/2016 |
| CN | 105528986 A | 4/2016 |
| CN | 106057147 A | 10/2016 |
| CN | 106356015 A | 1/2017 |
| CN | 106531117 A | 3/2017 |
| CN | 106920526 A | 7/2017 |
| KR | 20160077315 A | 7/2016 |

OTHER PUBLICATIONS

Search Report and Written Opinion for International Application No. PCT/CN2018/079815 dated Jun. 29, 2018.

* cited by examiner

SHIFT REGISTER, DRIVING METHOD THEREOF, GATE DRIVING CIRCUIT AND DISPLAY APPARATUS

CROSS REFERENCE TO RELATED APPLICATIONS

The present application is the U.S. national phase entry of PCT/CN2018/079815, with an international filing date of Mar. 21, 2018, which claims the benefit of the Chinese Patent Application No. 201710308386.6 filed on May 4, 2017, the entire disclosures of which are hereby incorporated by reference.

TECHNICAL FIELD

The present disclosure relates to the field of display technologies, and in particular, to a shift register, a driving method thereof, and a gate driving circuit.

BACKGROUND

With the advent of the technology known as Gate Driver on Array (GOA), display panels with narrow bezels are possible. The GOA technology directly integrates the gate driving circuit, including a plurality of cascaded shift registers, on the array substrate to replace an external driver chip, providing advantages such as high integration and small footprint.

SUMMARY

According to an exemplary embodiment of the present disclosure, a shift register is provided comprising an input terminal for receiving an input signal; a reset terminal for receiving a reset signal; a first clock terminal for receiving a first clock signal; a second clock terminal for receiving a second clock signal; a control terminal for receiving a control signal; an output terminal for outputting an output signal; a node control circuit configured to set a potential at a first node under control of the input signal, the reset signal, and a potential at a second node, the node control circuit further configured to set the potential at the second node under control of the second clock signal and the potential at the first node; an output circuit configured to output the output signal at the output terminal under control of the first clock signal, the potential at the first node, the potential at the second node, and the reset signal, wherein the output circuit comprises a de-noising transistor comprising a gate connected to the second node, a drain connected to the output terminal, and a source; and a threshold voltage control circuit configured to set a potential at the source of the de-noising transistor under control of the control signal and the potential at the second node to achieve a balance between a gate voltage and a source voltage of the de-noising transistor during a time interval.

In some exemplary embodiments, the node control circuit comprises a first node control circuit configured to set the potential at the first node to be active in response to the input signal being active, and to set the potential at the first node to be inactive in response to at least one of the reset signal or the potential at the second node being active; and a second node control circuit configured to set the potential at the second node to be active in response to the second clock signal being active, and to set the potential at the second node to be inactive in response to the potential at the first node being active.

In some exemplary embodiments, the first node control circuit comprises a first transistor comprising a gate connected to the input terminal, a first electrode connected to the input terminal, and a second electrode connected to the first node; a second transistor comprising a gate connected to the reset terminal, a first electrode connected to the first node, and a second electrode connected to a reference level terminal for supplying a reference voltage having an inactive level; and a seventh transistor comprising a gate connected to the second node, a first electrode connected to the first node, and a second electrode connected to the reference level terminal.

In some exemplary embodiments, the second node control circuit comprises a fifth transistor comprising a gate connected to the first node, a first electrode connected to the second node, and a second electrode connected to the reference level terminal; and a sixth transistor comprising a gate connected to the second clock terminal, a first electrode connected to the second clock terminal, and a second electrode connected to the second node.

In some exemplary embodiments, the output circuit comprises a third transistor configured to transfer the first clock signal to the output terminal in response to the potential at the first node being active; a fourth transistor configured to transfer the source voltage of the de-noising transistor to the output terminal in response to the reset signal being active; an eighth transistor acting as the de-noising transistor and configured to transfer the source voltage of the de-noising transistor to the output terminal in response to the potential at the second node being active; and a first capacitor connected between the first node and the output terminal.

In some exemplary embodiments, the third transistor comprises a gate connected to the first node, a first electrode connected to the first clock terminal, and a second electrode connected to the output terminal, and the fourth transistor comprises a gate connected to the reset terminal, a first electrode connected to the output terminal, and a second electrode connected to the source of the de-noising transistor.

In some exemplary embodiments, the control terminal comprises a first control terminal and a second control terminal, and the threshold voltage control circuit comprises: a ninth transistor configured to bring the gate of the de-noising transistor out of conduction with the source of the de-noising transistor in response to a signal received at the second control terminal being inactive, and to bring the gate of the de-noising transistor into conduction with the source of the de-noising transistor during the time interval in response to the signal received at the second control terminal being active during the time interval; and a tenth transistor configured to bring a reference level terminal for supplying a reference voltage having an inactive level into conduction with the source of the de-noising transistor in response to a signal received at the first control terminal being active, and to bring the reference level terminal out of conduction with the source of the de-noising transistor in response to the signal received at the first control terminal being inactive during the time interval.

In some exemplary embodiments, the ninth transistor comprises a gate connected to the second control terminal, a first electrode connected to the second node, and a second electrode connected to the source of the de-noising transistor, and the tenth transistor comprises a gate connected to the first control terminal, a first electrode connected to the reference level terminal, and a second electrode connected to the source of the de-noising transistor.

In some exemplary embodiments, the shift register further comprises a second capacitor connected between the source of the de-noising transistor and the reference level terminal.

According to another exemplary embodiment of the present disclosure, a method of driving a shift register is provided. The shift register comprises an input terminal for receiving an input signal, a reset terminal for receiving a reset signal, a first clock terminal for receiving a first clock signal, a second clock terminal for receiving the second clock signal, a control terminal for receiving a control signal, an output terminal for outputting an output signal, a node control circuit, an output circuit, and a threshold voltage control circuit. The method comprises setting, by the node control circuit, a potential at a first node under control of the input signal, the reset signal, and a potential at a second node; setting, by the node control circuit, the potential at the second node under control of the second clock signal and the potential at the first node; outputting, by the output circuit, the output signal at the output terminal under control of the first clock signal, the potential at the first node, the potential at the second node, and the reset signal, wherein the output circuit comprises a de-noising transistor comprising a gate connected to the second node, a drain connected to the output terminal, and a source; and setting, by the threshold voltage control circuit, a potential at the source of the de-noising transistor under control of the control signal and the potential at the second node to achieve a balance between a gate voltage and a source voltage of the de-noising transistor during a time interval.

According to yet another exemplary embodiment of the present disclosure, a gate driving circuit is provided comprising N cascaded shift registers as described above, N being a positive integer greater than or equal to 2. The output terminal of an m-th one of the shift registers is connected to the input terminal of an (m+1)-th one of the shift registers, m being an integer and 1≤m<N. The output terminal of an n-th one of the shift registers is connected to the reset terminal of an (n−1)-th one of the shift registers, n being an integer and 1<n≤N.

According to still yet another exemplary embodiment of the present disclosure, a display apparatus is provided comprising the gate driving circuit as described above.

These and other exemplary embodiments of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In some cases, some of the transistors in a GOA structure have to be turned on for a long period of time to remove noise. These transistors may fail, for example, become difficult to turn on, after a long period of operation. This may be caused by a rise in the threshold voltage of these transistors due to the fact that the difference between their gate voltage and source voltage is at a high level for a long time. Based on the insight into this problem, solutions are proposed that are described below in detail in connection with the embodiments and the drawings.

Figure 1:
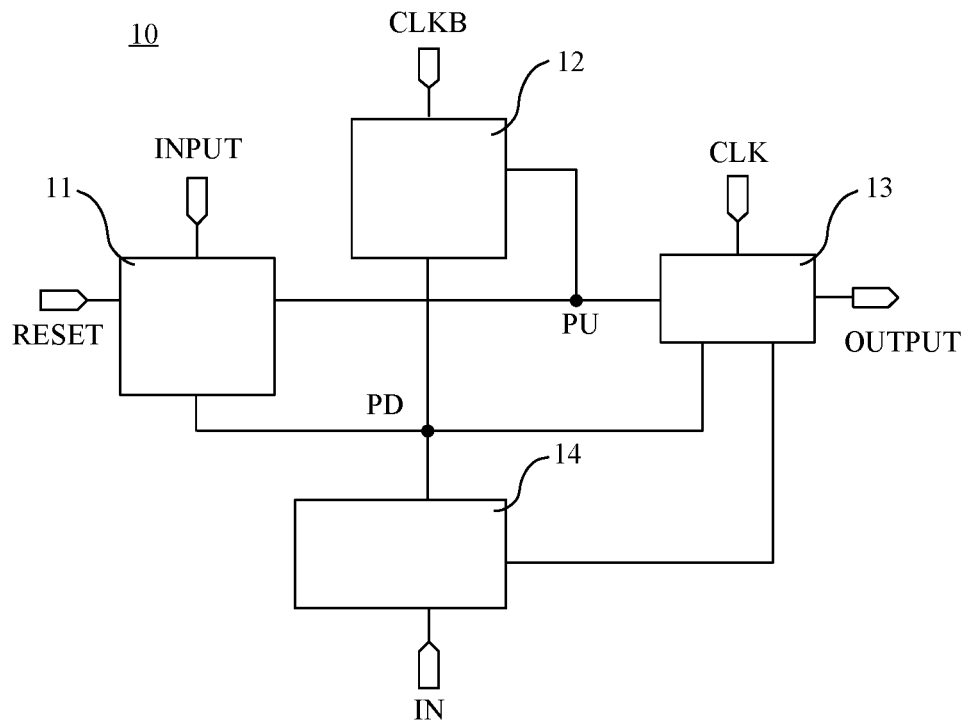
FIG. 1 is a block diagram of a shift register in accordance with an embodiment of the present disclosure.

FIG. 1 is a block diagram of a shift register 10 in accordance with an embodiment of the present disclosure. As shown in FIG. 1, the shift register 10 includes an input terminal INPUT for receiving an input signal, a reset terminal RESET for receiving a reset signal, a first clock terminal CLK for receiving a first clock signal, and a second clock terminal CLKB for receiving a second clock signal, a control terminal IN for receiving a control signal, and an output terminal OUTPUT for outputting an output signal. The shift register 10 also includes a node control circuit shown as being embodied by both a first node control circuit 11 and a second node control circuit 12, an output circuit 13, and a threshold voltage control circuit 14.

The node control circuit is configured to set a potential at the first node PU under control of the input signal, the reset signal, and a potential at the second node PD, and to set the potential at the second node PD under control of the second clock signal and the potential at the first node PU. Specifically, the first node control circuit 11 sets the potential at the first node PU to be active in response to the input signal being active, and sets the potential at the first node PU to be inactive in response to at least one of the reset signal or the potential at the second node PD being active. The second node control circuit 12 sets the potential at the second node PD to be active in response to the second clock signal being active, and sets the potential at the second node PD to be inactive in response to the potential at the first node PU being active.

The phrase "signal or potential being active" as used herein in connection with a circuit or a component of a circuit means that the circuit or the component of the circuit is enabled under control of the signal or potential. In contrast, the phrase "signal or potential being inactive" means that the circuit or the component of the circuit is disabled under control of the signal or potential. For example, for an N-type transistor, the active signal or potential has a high level and the inactive signal or potential has a low level.

The output circuit 13 is configured to output the output signal at the output terminal OUTPUT under control of the first clock signal, the potential at the first node PU, the potential at the second node PD, and the reset signal. As will be described below, the output circuit 13 includes a de-noising transistor including a gate connected to the second node PD, a drain connected to the output terminal OUTPUT, and a source.

The threshold voltage control circuit 14 is configured to set a potential at the source of the de-noising transistor under control of the control signal and the potential at the second node PD to achieve a balance between a gate voltage and a source voltage of the de-noising transistor during a time interval. By introducing the threshold voltage control circuit into the shift register 10, the gate voltage and source voltage of the de-noising transistor in the shift register 10 are balanced (e.g., equal or substantially equal, as will be described later) during the time interval. This is advantageous in avoiding the rise of the transistor's threshold voltage due to the transistor being turned on for a long time, thereby alleviating or even eliminating the failure of the transistor.

Figure 2:
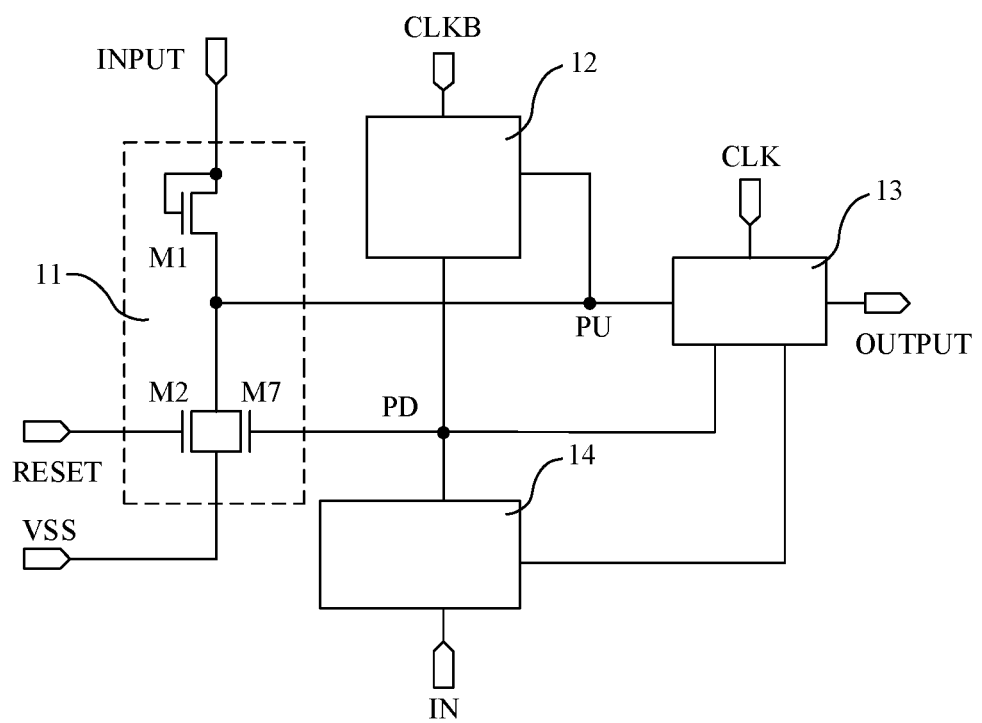
FIG. 2 is a schematic diagram illustrating an example circuit of a first node control circuit on the basis of FIG. 1.

FIG. 2 is a schematic diagram showing an example circuit of the first node control circuit 11 on the basis of FIG. 1. As shown in FIG. 2, the first node control circuit 11 includes a first transistor M1, a second transistor M2, and a seventh transistor M7.

The first transistor M1 has a gate and a first electrode connected to the input terminal INPUT and a second electrode connected to the first node PU. When the input signal received at the input terminal INPUT is active, the first transistor M1 is turned on to set the potential at the first node PU to be active.

The second transistor M2 has a gate connected to the reset terminal RESET, a first electrode connected to the first node PU, and a second electrode connected to a reference level terminal VSS supplying a reference voltage having an inactive level.

When the reset signal received at the reset terminal RESET is active, the second transistor M2 is turned on to set the potential at the first node PU to be inactive.

The seventh transistor M7 has a gate connected to the second node PD, a first electrode connected to the first node PU, and a second electrode connected to the reference level terminal VSS. When the second node PD is at the active potential, the seventh transistor M7 is turned on to set the potential at the first node PU to be inactive.

Figure 3:
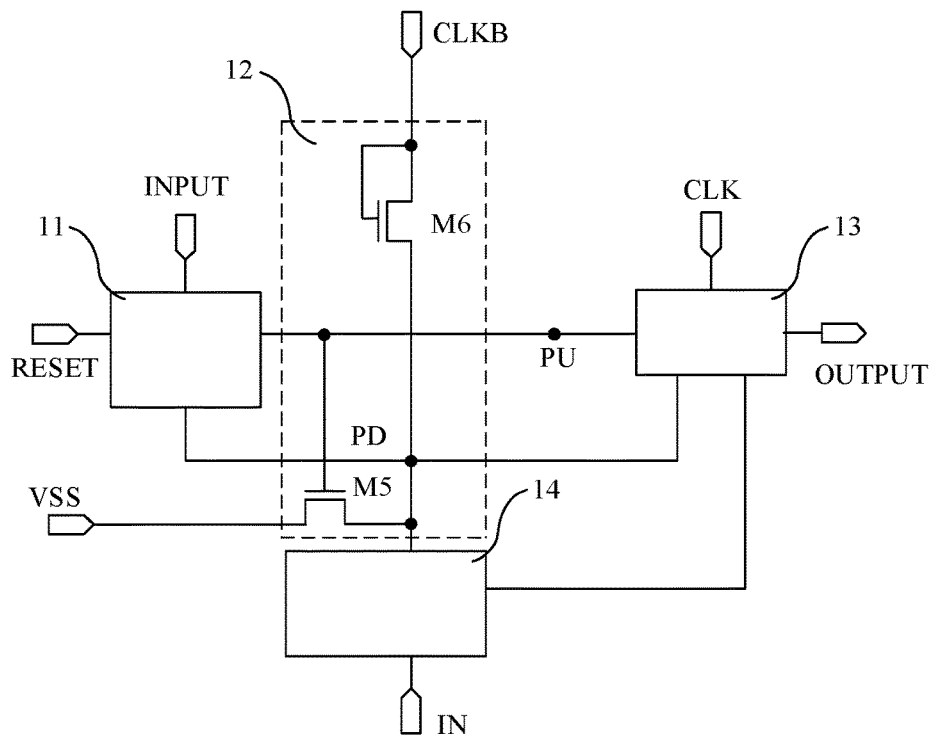
FIG. 3 is a schematic diagram illustrating an example circuit of a second node control circuit on the basis of FIG. 1.

FIG. 3 is a schematic diagram of an example circuit illustrating the second node control circuit 12 on the basis of FIG. 1. As shown in FIG. 3, the second node control circuit 12 includes a fifth transistor M5 and a sixth transistor M6.

The fifth transistor M5 has a gate connected to the first node PU, a first electrode connected to the second node PD, and a second electrode connected to the reference level terminal VSS. When the first node PU is at an active potential, the fifth transistor M5 is turned on to set the potential at the second node PD to be inactive.

The sixth transistor M6 has a gate and a second electrode connected to the second clock terminal CLKB and a first electrode connected to the second node PD. When the second clock signal received at the second clock terminal CLKB is active, the sixth transistor M6 is turned on to set the potential at the second node PD to be active.

Figure 4:
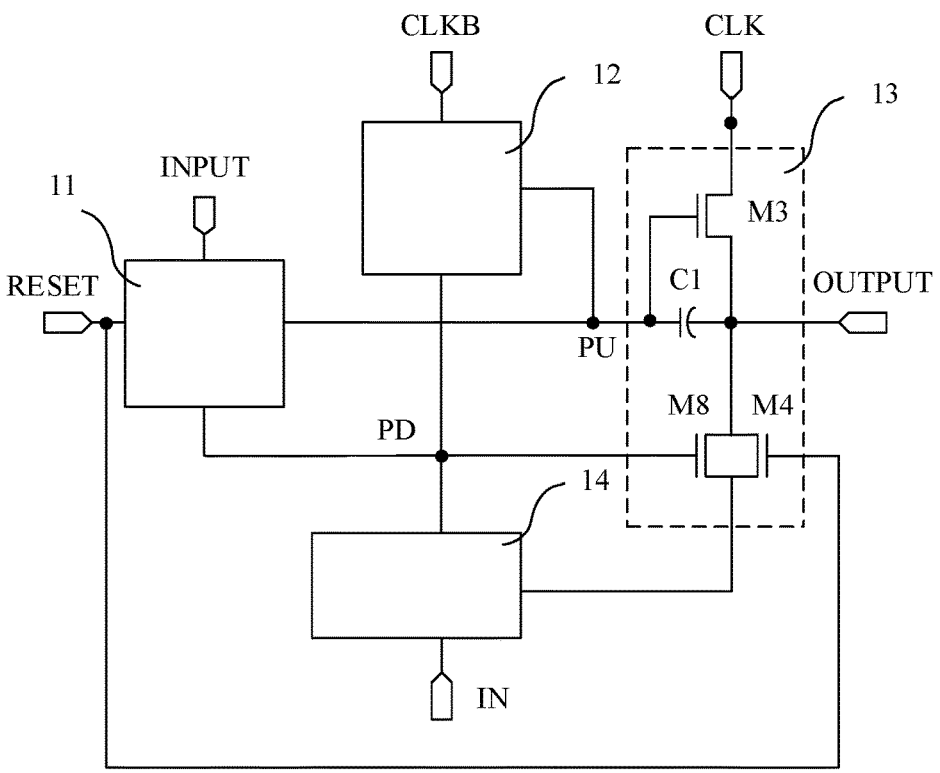
FIG. 4 is a schematic diagram illustrating an example circuit of an output circuit on the basis of FIG. 1.

FIG. 4 is a schematic diagram of an example circuit illustrating the output circuit 13 on the basis of FIG. 1. As shown in FIG. 4, the output circuit 13 includes a third transistor M3, a fourth transistor M4, an eighth transistor M8, and a first capacitor C1.

The eighth transistor M8 has a gate connected to the second node PD, a first electrode connected to the output terminal OUTPUT, and a second electrode connected to the threshold voltage control circuit 14. The eighth transistor M8 acts as the de-noising transistor. As will be described later, when the second node PD is at the active potential, the eighth transistor M8 is turned on to set the potential at the output terminal OUTPUT to be inactive. This may maintain the output signal output at the output terminal OUTPUT at an inactive potential, thereby eliminating noise.

The third transistor M3 has a gate connected to the first node PU, a first electrode connected to the first clock terminal CLK, and a second electrode connected to the output terminal OUTPUT. When the first node PU is at the active potential, the third transistor M3 is turned on to output the first clock signal received at the first clock terminal CLK as an output signal from the output terminal OUTPUT.

The fourth transistor M4 has a gate connected to the reset terminal RESET, a first electrode connected to the output terminal OUTPUT, and a second electrode connected to the threshold voltage control circuit 14. As will be described later, when the reset signal received at the reset terminal RESET is active, the fourth transistor M4 is turned on to set the potential at its output terminal OUTPUT to be inactive.

The first capacitor C1 is connected between the first node PU and the output terminal OUTPUT. The first capacitor C1 may be charged such that the potential at the first node PU is set to be active.

Figure 5:
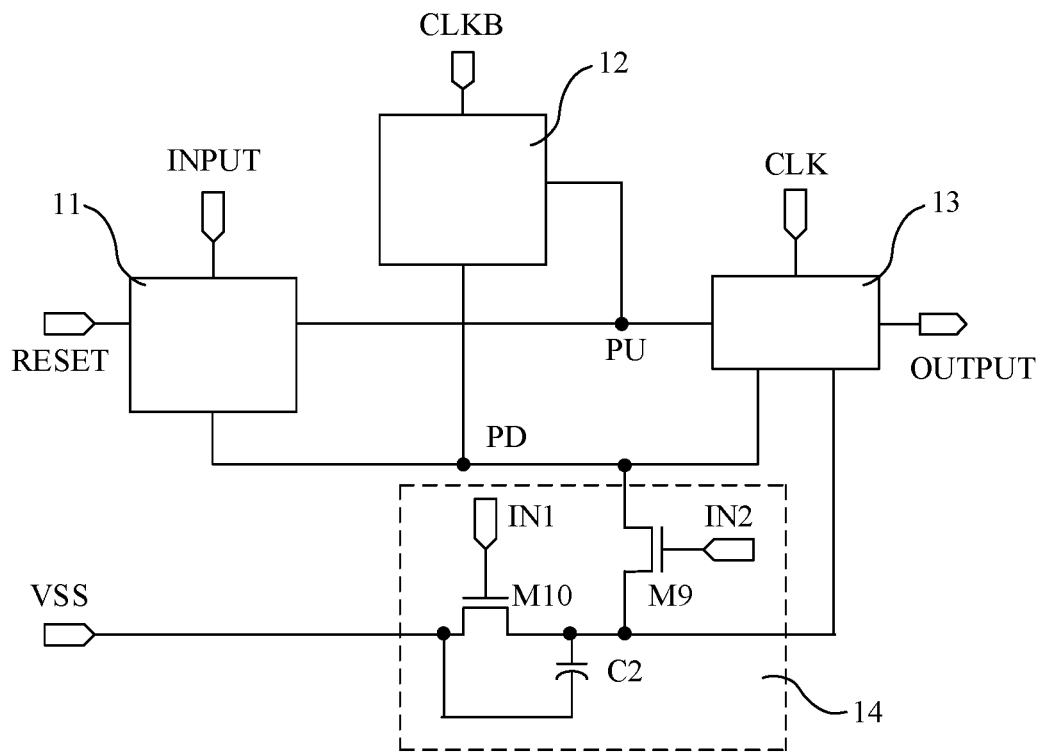
FIG. 5 is a schematic diagram illustrating an example circuit of a threshold voltage control circuit on the basis of FIG. 1.

FIG. 5 is a schematic diagram of an example circuit illustrating the threshold voltage control circuit 14 on the basis of FIG. 1. As shown in FIG. 5, the threshold voltage control circuit 14 includes a ninth transistor M9 and a tenth transistor M10. In FIG. 5, the control terminal IN shown in FIG. 1 is shown to include a first control terminal IN1 and a second control terminal IN2.

The ninth transistor M9 has a gate connected to the second control terminal IN2, a first electrode connected to the second node PD, and a second electrode connected to the output circuit 13. As will be described later, when the signal received at the second control terminal IN2 is active, the ninth transistor M9 is turned on to bring the gate of the de-noising transistor (for example, the eighth transistor M8 shown in FIG. 4) into conduction with the source of the noise transistor. In this case, the gate voltage of the de-noising transistor is equal to or substantially equal to the source voltage of the de-noising transistor, thereby allowing for a shortened period of time in which the gate-source voltage of the de-noising transistor is at a high level. This is advantageous to alleviate or eliminate failure due to drift of the threshold voltage of the de-noising transistor. The phrase "A being substantially equal to B" as used herein may mean that A is equal to B or the difference between A and B falls within a tolerance due to, for example, engineering errors.

The tenth transistor M10 has a gate connected to the first control terminal IN1, a first electrode connected to the reference level terminal VSS, and a second electrode connected to the second electrode of the ninth transistor M9. As will be described later, the tenth transistor M10 is turned off when the signal received at the first control terminal IN1 is inactive to disconnect the source of the de-noising transistor (for example, the eighth transistor M8 shown in FIG. 4) from the reference level terminal VSS, and is turned on when the signal received at the first control terminal IN1 is active to transfer the reference voltage having the inactive level from the reference level terminal VSS to the source of the de-noising transistor.

The threshold voltage control circuit 14 further according to an exemplary embodiment includes a second capacitor C2 connected between the source of the de-noising transistor (e.g., the eighth transistor M8 shown in FIG. 4) and the reference level terminal VSS. The second capacitor C2 is used to provide a buffering capability when the ninth transistor M9 is turned on to avoid potential damage caused by a sharp change in the gate-source voltage of the de-noising transistor.

Figure 6:
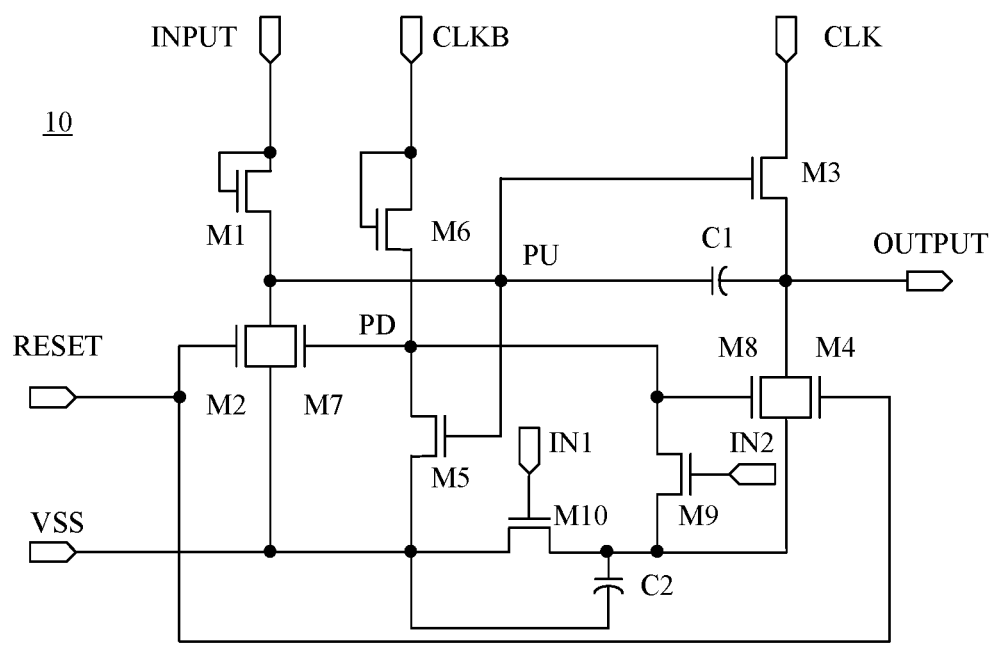
FIG. 6 is a schematic circuit diagram of a shift register in accordance with an embodiment of the present disclosure.

FIG. 6 is a schematic circuit diagram of a shift register 10 in accordance with an embodiment of the present disclosure. As shown in FIG. 6, the shift register 10 includes ten transistor circuits (M1 to M10), two capacitors (C1 and C2), and a plurality of input/output terminals (INPUT, RESET, CLK, CLKB, VSS, IN1, IN2 and OUTPUT).

The configuration of such a shift register 10 has been described in detail above with respect to FIGS. 2-5 and will not be repeated here for the sake of brevity. While each of the transistors is illustrated and described above as an N-type transistor, a P-type transistor is possible in other embodiments. In the case of a P-type transistor, the active signal has a low level and the inactive signal has a high level. Each of the transistors may take the form of, for example, a thin film transistor, although other embodiments are possible. Thin film transistors are typically fabricated such that their first and second electrodes are used interchangeably. In this case, the source and drain of the transistor are defined in the application circuit. For example, for the eighth transistor M8 serving as the de-noising transistor, its first electrode connected to the output terminal OUTPUT is defined as a drain, and its second electrode connected to the second capacitor C2 is defined as a source.

Figure 7:
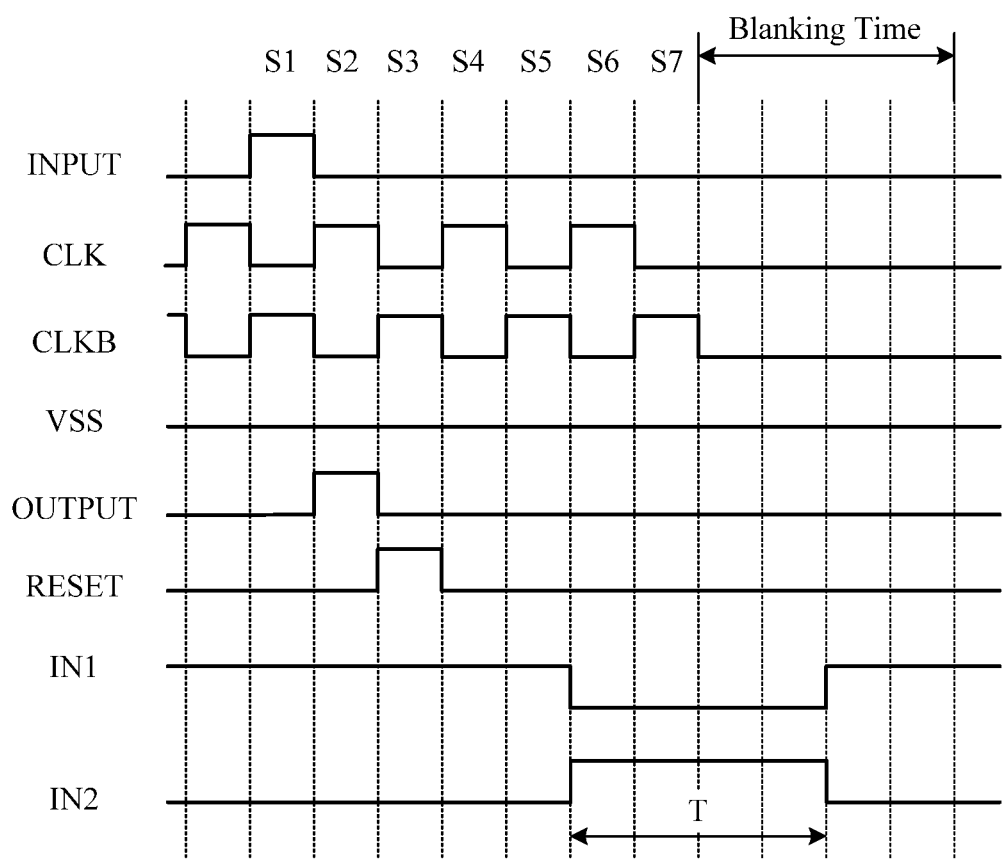
FIG. 7 is an example timing diagram of the shift register shown in FIG. 6.

FIG. 7 is an exemplary timing diagram of the shift register 10 shown in FIG. 6. The operation of the shift register 10 will be described below with reference to FIGS. 6 and 7.

In a first phase S1, the input signal received at the input INPUT is active such that the first transistor M1 is turned on to set the potential at the first node PU to be active. Due to the active potential at the first node PU, the fifth transistor M5 is turned on to set the potential at the second node PD to be inactive by transferring the inactive reference voltage from the reference level terminal VSS to the second node PD. Due to the inactive potential at the second node PD, the seventh transistor M7 and the eighth transistor M8 are turned off. The active potential at the first node PU also turns on the third transistor M3 to transfer the inactive first clock signal at the first clock terminal CLK to the output terminal OUTPUT. An inactive output signal is output at the output terminal OUTPUT.

In a second phase S2, the input signal received at the input terminal INPUT is inactive and the first transistor M1 is turned off. Due to the presence of the first capacitor C1, the first node PU remains at an active potential, and thus the second node PD remains at an inactive level. The active potential at the first node PU turns on the third transistor M3, and the active first clock signal at the first clock terminal CLK is transferred to the output terminal OUTPUT through the third transistor M3. Due to the bootstrap effect of the first capacitor C1, the potential at the first node PU is changed to be further active. An active output signal is output at the output terminal OUTPUT.

In a third phase S3, the reset signal received at the reset terminal RESET is active, and the second clock signal received at the second clock terminal CLKB is active. The second transistor M2 and the fourth transistor M4 are turned on due to the active reset signal at the reset terminal RESET. The fourth transistor M4 transfers the source voltage of the eighth transistor M8 to the output terminal OUTPUT. Since the signal received at the first control terminal IN1 is active, the tenth transistor M10 is turned on and thus the source voltage of the eighth transistor M8 is equal to the inactive reference voltage of the reference level terminal VSS. Therefore, the potential at the output terminal OUTPUT is set to be inactive. The second transistor M2 sets the potential at the first node PU to be inactive by transferring the inactive reference voltage of the reference level terminal VSS to the first node PU, and the third transistor M3 and the fifth transistor M5 are turned off. Since the second clock signal at the second clock terminal CLKB is active, the sixth transistor M6 is turned on and the potential at the second node PD is set to be active, turning on the seventh transistor M7 and the eighth transistor M8. As with the second transistor M2, the seventh transistor M7 also transfers the inactive reference voltage of the reference level terminal VSS to the first node PU, so that the potential at the first node PU remains inactive. As with the fourth transistor M4, the eighth transistor M8 also transfers an inactive reference voltage of the reference level terminal VSS to the output terminal OUTPUT, ensuring that the output signal at the output terminal OUTPUT is inactive, thereby reducing noise at the output terminal OUTPUT. Therefore, the eighth transistor M8 is also referred to herein as a de-noising transistor.

In a fourth phase S4, the first clock signal received at the first clock terminal CLK becomes active, and the second clock signal received at the second clock terminal CLKB becomes inactive. Since the third transistor M3 is in the off state at this time, the active first clock signal cannot be transferred to the output terminal OUTPUT, so that the output signal at the output terminal OUTPUT remains inactive. The first node PU remains at an inactive potential and the second node PD remains at an active potential. The de-noising transistor M8 is turned on to continuously transfer the inactive reference voltage of the reference level terminal VSS to the output terminal OUTPUT, ensuring the stability of the output signal and eliminating the noise.

In a fifth phase S5, the first clock signal received at the first clock terminal CLK becomes inactive, and the second clock signal received at the second clock terminal CLKB becomes active. The active second clock signal at the second clock terminal CLKB turns on the sixth transistor M6, leaving the potential at the second node PD remain active. Therefore, the de-noising transistor M8 is still in an on state to continue de-noising. From the first phase S1 to the fifth phase S5, the signal received at the first control terminal IN1 remains active, and the signal received at the second control terminal IN2 remains inactive. Therefore, the tenth transistor M10 is continuously turned on to continuously transfer the inactive reference voltage of the reference level terminal VSS to the source of the de-noising transistor M8, and the ninth transistor M9 is continuously turned off to bring the gate of the de-noising transistor M8 out of conduction with the source of the de-noising transistor M8.

Although the fourth phase S4 and the fifth phase S5 are shown as being performed only once in FIG. 7, the fourth phase S4 and the fifth phase S5 may be repeated several times in the application of the gate driving circuit, so that de-noising transistor M8 is turned on for a long period of time. In this case, the gate-source voltage of the de-noising transistor M8 is at a high level for a long period of time, causing a drift of its threshold voltage. This can be alleviated or eliminated by operations of subsequent phases.

In a sixth phase S6, the first clock signal received at the first clock terminal CLK becomes active, the second clock signal received at the second clock terminal CLKB becomes inactive, the signal received at the first control terminal IN1 becomes inactive from active, and the signal received at the second control terminal IN2 becomes active from inactive. The active signal at the second control terminal IN2 turns on the ninth transistor M9 to bring the gate of the de-noising transistor M8 into conduction with the source of the de-noising transistor M8, providing a balance between the gate voltage and the source voltage of the de-noising transistor M8. That is, the gate voltage of the de-noising transistor M8 is equal to or substantially equal to the source voltage of the de-noising transistor M8. The active potential at the second node PD further charges the second capacitor C2. The inactive signal at the first control terminal IN1 turns off the tenth transistor M10 to disconnect the source of the de-noising transistor M8 from the reference level terminal VSS, and allows for the charging of the second capacitor C2. The first node PU remains at an inactive potential and the second node PD remains at an active potential.

In a seventh phase S7, the first clock signal received at the first clock terminal CLK becomes inactive, the second clock signal received at the second clock terminal CLKB becomes active, the signal received at the first control terminal IN1 is still inactive, and the signal received at the second control terminal IN2 is still active. The active second clock signal at the second clock terminal CLKB turns on the sixth transistor M6, leaving the second node PD remain at an active potential. The active signal at the second control terminal IN2 causes the ninth transistor M9 to remain on continuously, thereby continuing to provide the balance between the gate voltage and the source voltage of the de-noising transistor M8. As shown in FIG. 7, the signal received at the first control terminal IN1 is kept inactive during a time interval T, and the signal received at the second control terminal IN2 is kept active during the time interval T. As a result, the balance between the gate voltage and the source voltage of the de-noising transistor M8 is maintained for the time interval T. This may avoid the rise of the threshold voltage due to the de-noising transistor M8 being turned on for a long time, alleviating or eliminating the failure problem of the de-noising transistor M8.

After the seventh phase S7, the first clock signal at the first clock terminal CLK and the second clock signal at the second clock terminal CLKB may be stopped from being supplied until the input signal at the input terminal INPUT becomes active. Then, the first clock signal and the second clock signal are again supplied, and the operation of the shift register 10 is restarted from the first phase S1. The period of time in which the first clock signal and the second clock signal are stopped from being supplied is referred to as Blanking Time. In the application of the gate driving circuit, the Blanking Time can roughly correspond to the vertical blanking interval of the display panel. If the threshold voltage control circuit 14 were not present, the gate-source voltage of the de-noising transistor M8 would continue to be at a high level during the Blanking Time, resulting in aggravation of the threshold voltage drift. In contrast, by introducing the threshold voltage control circuit 14 including the ninth transistor M9 and the tenth transistor M10 (and according to another exemplary embodiment the second capacitor C2) into the shift register 10, the gate-source voltage of the de-noising transistor M8 is no longer at a high level during the Blanking Time, facilitating alleviation of the threshold voltage drift of the de-noising transistor M8. In practice, the first control terminal IN1 and the second control terminal IN2 may be applied with an inactive signal and an active signal respectively at any time after the fifth phase S5, and the application is maintained for the time interval T up to any moment in the Blanking Time. In the example shown in FIG. 7, the first control terminal IN1 and the second control terminal IN2 are applied with an inactive signal and an active signal respectively at the end of the fifth phase S5 and at the beginning of the sixth phase S6.

Figure 8:
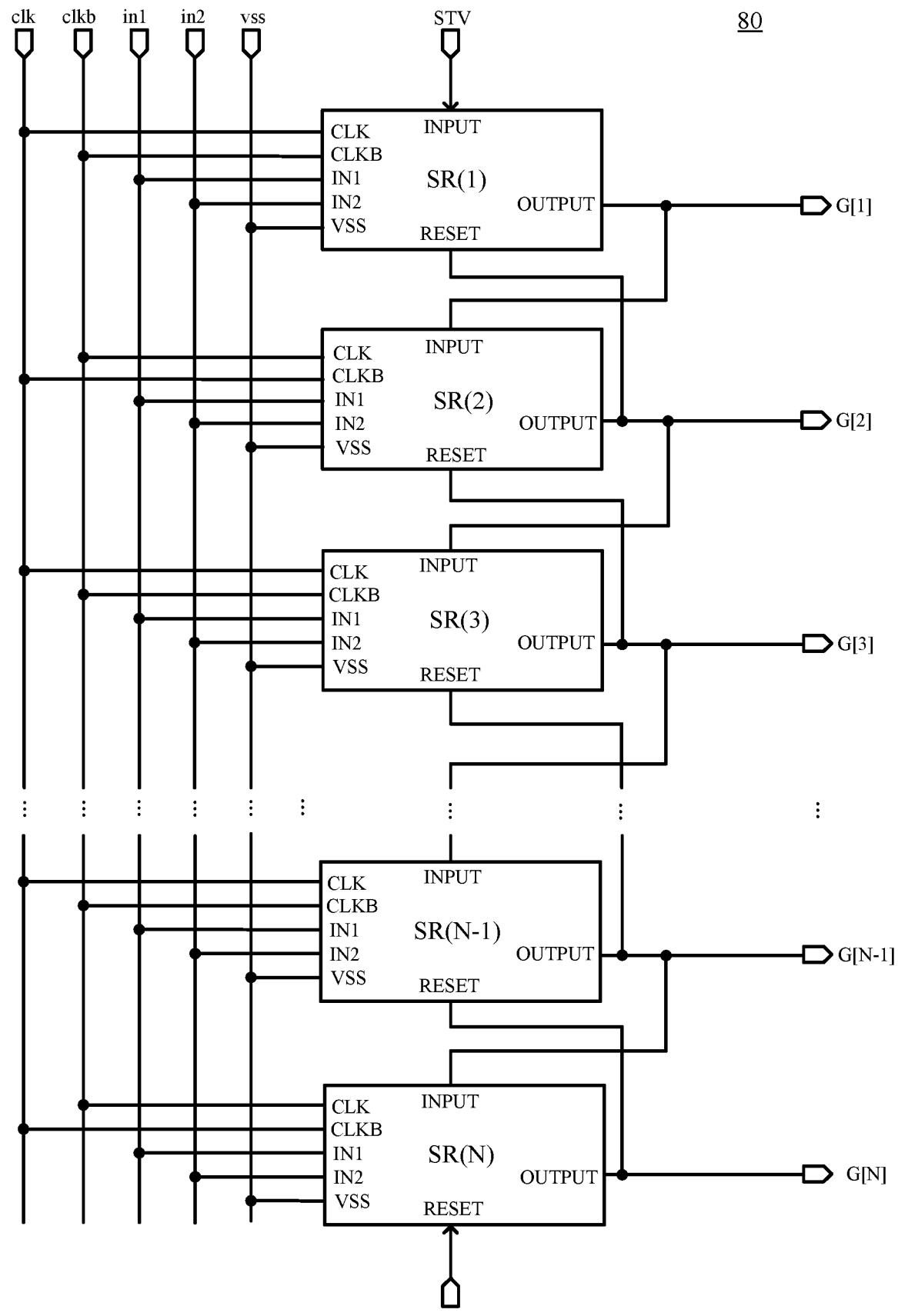
FIG. 8 is a block diagram of a gate driving circuit in accordance with an embodiment of the present disclosure.

FIG. 8 is a block diagram of a gate driving circuit 80 in accordance with an embodiment of the present disclosure. Referring to FIG. 8, the gate driving circuit 80 includes N cascaded shift registers SR(1), SR(2), SR(3), SR(N−1) and SR(N), each of which may take the form of the shift register 10 as described above with respect to FIGS. 1-7. N may be an integer greater than or equal to 2.

In the gate driving circuit 80, the first shift register SR(1) of the shift registers receives a start signal STV as an input signal at its input terminal IN. Except for the last shift register SR(N), the output terminal OUT of each of the shift registers is connected to the input terminal IN of the adjacent next shift register, and except for the first shift register SR (1), the output terminal OUT of each of the shift registers is connected to the reset terminal RST of the adjacent previous shift register. The N shift registers SR(1), SR(2), SR(3), SR(N−1) and SR(N) are further connected to N gate lines G[1], G[2], G[3], . . . , G[N−1] and G[N], respectively. Each of the shift registers is further connected to a first clock line clk that transfers a clock signal, a second clock line clkb that transfers another clock signal inverted from the clock signal, a first control line in1 that transfers a control signal, a second control line in2 that transfers another control signal inverted from the control signal, and a reference voltage line vss that transfers a reference voltage having an inactive level. Specifically, the first clock terminal CLK of a (2k−1)-th one of the shift registers is connected to the first clock line clk, and the second clock terminal CLKB of the (2k−1)-th shift register is connected to the second clock line clkb. The first clock terminal CLK of a 2k-th one of the shift registers is connected to the second clock line clkb, and the second clock terminal CLKB of the 2k-th shift register is connected to the first clock line clk. k is a positive integer and 2k≤N.

Figure 9:
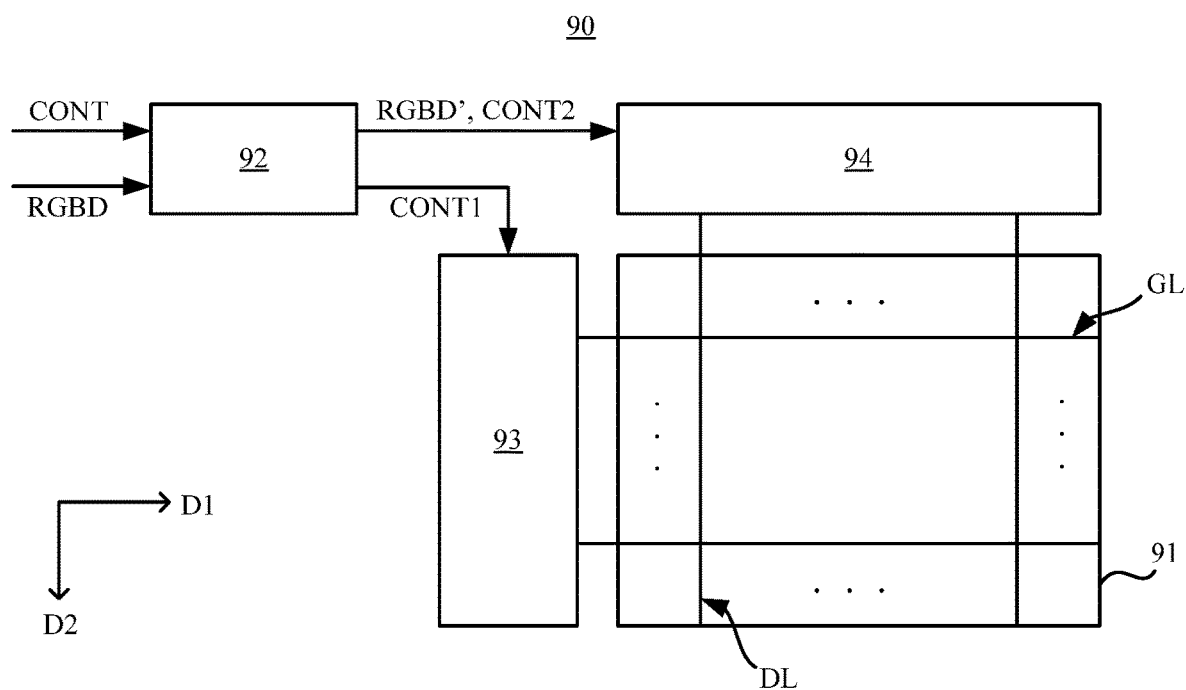
FIG. 9 is a block diagram of a display apparatus in accordance with an embodiment of the present disclosure.

FIG. 9 is a block diagram of a display apparatus 90 in accordance with an embodiment of the present disclosure. Referring to FIG. 9, the display apparatus 90 includes a display panel 91, a timing controller 92, a gate driver 93, and a data driver 94. The gate driver 93 may take the form of the gate driving circuit 80 described above with respect to FIG. 8, and the first clock line clk, the second clock line clkb, the first control line in1, the second control line in2, and the reference voltage line vss shown in FIG. 8 are omitted in FIG. 9 for convenience of illustration.

The display panel 91 is connected to a plurality of gate lines GL extending in a first direction D1 and a plurality of data lines DL extending in a second direction D2 intersecting (e.g., substantially perpendicular to) the first direction D1. The display panel 91 includes a plurality of pixels (not shown) arranged in a matrix form. Each of the pixels may be electrically connected to a corresponding one of the gate lines GL and a corresponding one of the data lines DL. The display panel 91 can be a liquid crystal display panel, an organic light emitting diode (OLED) display panel, or any other suitable type of display panel.

The timing controller 92 controls the operations of the display panel 91, the gate driver 93, and the data driver 94. The timing controller 92 receives input image data RGBD and an input control signal CONT from an external apparatus (for example, a host). The input image data RGBD may include a plurality of input pixel data for the plurality of pixels. Each of the input pixel data may include red grayscale data R, green grayscale data G, and blue grayscale data B for a corresponding one of the plurality of pixels. The input control signal CONT may include a main clock signal, a data enable signal, a vertical sync signal, a horizontal sync signal, and the like. The timing controller 92 generates output image data RGBD', a first control signal CONT1, and a second control signal CONT2 based on the input image data RGBD and the input control signal CONT. Implementations of timing controller 92 are known in the art. The timing controller 92 can be implemented in a number of ways (e.g., using dedicated hardware) to perform the various functions discussed herein. A "processor" is an example of the timing controller 92 that employs one or more microprocessors that can be programmed using software (e.g., microcode) to perform the various functions discussed herein. The timing controller 92 can be implemented with or without a processor, and can also be implemented as a combination of dedicated hardware that performs some functions and a processor that performs other functions. Examples of timing controller 92 include, but are not limited to, conventional microprocessors, application specific integrated circuits (ASICs), and field programmable gate arrays (FPGAs).

The gate driver 93 receives the first control signal CONT1 from the timing controller 92. The first control signal CONT1 may include two clock signals transferred via the first and second clock lines clk and clkb shown in FIG. 8 and having opposite phases, and two control signals transferred via the first and second controls lines in1 and in2 shown in FIG. 8 and having opposite phases. The gate driver 93 generates a plurality of gate driving signals for output to the gate line GL based on the first control signal CONT1. The gate driver 93 may sequentially apply the plurality of gate driving signals to the gate lines GL.

The data driver 94 receives the second control signal CONT2 and the output image data RGBD' from the timing controller 92. The data driver 94 generates a plurality of data voltages based on the second control signal CONT2 and the output image data RGBD'. The data driver 94 can apply the generated plurality of data voltages to the data lines DL.

In embodiments, the gate driver 93 and/or the data driver 94 may be disposed on the display panel 91 or may be connected to the display panel 91 by, for example, a Tape Carrier Package (TCP). For example, the gate driver 93 can be integrated in the display panel 91 as a GOA circuit. By way of example and not limitation, the display apparatus 90 can be any product or component having a display function, such as a cell phone, tablet, television, display, notebook computer, digital photo frame, navigator, and the like.

The foregoing describes certain exemplary embodiments for the purpose of understanding the present disclosure, and is not intended to limit the present disclosure. Various modifications and changes to the described embodiments can be made by a person skilled in the art without departing from the scope of the present disclosure. Thus, the scope of the disclosure is defined by the appended claims.

What is claimed is:

1. A shift register, comprising:
    an input terminal for receiving an input signal;
    a reset terminal for receiving a reset signal;
    a first clock terminal for receiving a first clock signal;
    a second clock terminal for receiving a second clock signal;
    a control terminal for receiving a control signal;
    an output terminal for outputting an output signal;
    a node control circuit configured to set a potential at a first node under control of the input signal, the reset signal, and a potential at a second node, the node control circuit further configured to set the potential at the second node under control of the second clock signal and the potential at the first node;
    an output circuit configured to output the output signal at the output terminal under control of the first clock signal, the potential at the first node, the potential at the second node, and the reset signal, wherein the output circuit comprises a de-noising transistor comprising a gate connected to the second node, a drain connected to the output terminal, and a source; and
    a threshold voltage control circuit configured to set a potential at the source of the de-noising transistor under control of the control signal and the potential at the second node to achieve a balance between a gate voltage and a source voltage of the de-noising transistor during a time interval.

2. The shift register of claim 1, wherein the node control circuit comprises:
    a first node control circuit configured to set the potential at the first node to be active in response to the input signal being active, and to set the potential at the first node to be inactive in response to at least one of the reset signal or the potential at the second node being active; and
    a second node control circuit configured to set the potential at the second node to be active in response to the second clock signal being active, and to set the potential at the second node to be inactive in response to the potential at the first node being active.

3. The shift register of claim 2, wherein the first node control circuit comprises:

a first transistor comprising a gate of the first transistor connected to the input terminal, a first electrode of the first transistor connected to the input terminal, and a second electrode of the first transistor connected to the first node;

a second transistor comprising a gate of the second transistor connected to the reset terminal, a first electrode of the second transistor connected to the first node, and a second electrode of the second transistor connected to a reference level terminal for supplying a reference voltage of the second transistor having an inactive level; and a seventh transistor comprising a gate of the seventh transistor connected to the second node, a first electrode of the seventh transistor connected to the first node, and a second electrode of the seventh transistor connected to the reference level terminal.

4. The shift register of claim 3, wherein the second node control circuit comprises:

a fifth transistor comprising a gate of the fifth transistor connected to the first node, a first electrode of the fifth transistor connected to the second node, and a second electrode of the fifth transistor connected to the reference level terminal; and a sixth transistor comprising a gate of the sixth transistor connected to the second clock terminal, a first electrode of the sixth transistor connected to the second clock terminal, and a second electrode of the sixth transistor connected to the second node.

5. The shift register of claim 4, wherein the control terminal comprises a first control terminal and a second control terminal, and wherein the threshold voltage control circuit comprises:

a ninth transistor configured to bring the gate of the de-noising transistor out of conduction with the source of the de-noising transistor in response to a signal received at the second control terminal being inactive, and to bring the gate of the de-noising transistor into conduction with the source of the de-noising transistor during the time interval in response to the signal received at the second control terminal being active during the time interval; and a tenth transistor configured to bring the reference level terminal for supplying a reference voltage of the tenth transistor having an inactive level into conduction with the source of the de-noising transistor in response to a signal received at the first control terminal being active, and to bring the reference level terminal out of conduction with the source of the de-noising transistor in response to the signal received at the first control terminal being inactive during the time interval.

6. The shift register of claim 3, wherein the control terminal comprises a first control terminal and a second control terminal, and wherein the threshold voltage control circuit comprises:

a ninth transistor configured to bring the gate of the de-noising transistor out of conduction with the source of the de-noising transistor in response to a signal received at the second control terminal being inactive, and to bring the gate of the de-noising transistor into conduction with the source of the de-noising transistor during the time interval in response to the signal received at the second control terminal being active during the time interval; and a tenth transistor configured to bring the reference level terminal for supplying a reference voltage of the tenth transistor having an inactive level into conduction with the source of the de-noising transistor in response to a signal received at the first control terminal being active, and to bring the reference level terminal out of conduction with the source of the de-noising transistor in response to the signal received at the first control terminal being inactive during the time interval.

7. The shift register of claim 2, wherein the control terminal comprises a first control terminal and a second control terminal, and wherein the threshold voltage control circuit comprises:

a ninth transistor configured to bring the gate of the de-noising transistor out of conduction with the source of the de-noising transistor in response to a signal received at the second control terminal being inactive, and to bring the gate of the de-noising transistor into conduction with the source of the de-noising transistor during the time interval in response to the signal received at the second control terminal being active during the time interval; and a tenth transistor configured to bring a reference level terminal for supplying a reference voltage of the tenth transistor having an inactive level into conduction with the source of the de-noising transistor in response to a signal received at the first control terminal being active, and to bring the reference level terminal out of conduction with the source of the de-noising transistor in response to the signal received at the first control terminal being inactive during the time interval.

8. The shift register of claim 1, wherein the output circuit comprises:

a third transistor configured to transfer the first clock signal to the output terminal in response to the potential at the first node being active;

a fourth transistor configured to transfer the source voltage of the de-noising transistor to the output terminal in response to the reset signal being active;

an eighth transistor acting as the de-noising transistor and configured to transfer the source voltage of the de-noising transistor to the output terminal in response to the potential at the second node being active; and a first capacitor connected between the first node and the output terminal.

9. The shift register of claim 8, wherein the third transistor comprises a gate of the third transistor connected to the first node, a first electrode of the third transistor connected to the first clock terminal, and a second electrode of the third transistor connected to the output terminal, and wherein the fourth transistor comprises a gate of the fourth transistor connected to the reset terminal, a first electrode of the fourth transistor connected to the output terminal, and a second electrode of the fourth transistor connected to the source of the de-noising transistor.

10. The shift register of claim 8, wherein the control terminal comprises a first control terminal and a second control terminal, and wherein the threshold voltage control circuit comprises:

a ninth transistor configured to bring the gate of the de-noising transistor out of conduction with the source of the de-noising transistor in response to a signal received at the second control terminal being inactive, and to bring the gate of the de-noising transistor into conduction with the source of the de-noising transistor during the time interval in response to the signal received at the second control terminal being active during the time interval; and a tenth transistor configured to bring a reference level terminal for supplying a reference voltage of the tenth transistor having an inactive level into conduction with the source of the de-noising transistor in response to a signal received at the first control terminal being active, and to bring the reference level terminal out of conduction with the source of the de-noising transistor in response to the signal received at the first control terminal being inactive during the time interval.

11. The shift register of claim 1, wherein the control terminal comprises a first control terminal and a second control terminal, and wherein the threshold voltage control circuit comprises:
  a ninth transistor configured to bring the gate of the de-noising transistor out of conduction with the source of the de-noising transistor in response to a signal received at the second control terminal being inactive, and to bring the gate of the de-noising transistor into conduction with the source of the de-noising transistor during the time interval in response to the signal received at the second control terminal being active during the time interval; and
  a tenth transistor configured to bring a reference level terminal for supplying a reference voltage of the tenth transistor having an inactive level into conduction with the source of the de-noising transistor in response to a signal received at the first control terminal being active, and to bring the reference level terminal out of conduction with the source of the de-noising transistor in response to the signal received at the first control terminal being inactive during the time interval.

12. The shift register of claim 11, wherein the ninth transistor comprises a gate of the ninth transistor connected to the second control terminal, a first electrode of the ninth transistor connected to the second node, and a second electrode of the ninth transistor connected to the source of the de-noising transistor, and wherein the tenth transistor comprises a gate of the tenth transistor connected to the first control terminal, a first electrode of the tenth transistor connected to the reference level terminal, and a second electrode of the tenth transistor connected to the source of the de-noising transistor.

13. The shift register of claim 11, further comprising a second capacitor connected between the source of the de-noising transistor and the reference level terminal.

14. A gate driving circuit comprising N cascaded shift registers as claimed in claim 1, N being a positive integer greater than or equal to 2, wherein:
  the output terminal of an m-th one of a plurality of shift registers is connected to the input terminal of an (m+1)-th one of the shift registers, m being an integer and 1≤m<N; and
  the output terminal of an n-th one of the shift registers is connected to the reset terminal of an (n−1)-th one of the shift registers, n being an integer and 1<n≤N.

15. A display apparatus comprising the gate driving circuit of claim 14.

16. A method of driving a shift register comprising an input terminal for receiving an input signal, a reset terminal for receiving a reset signal, a first clock terminal for receiving a first clock signal, a second clock terminal for receiving a second clock signal, a control terminal for receiving a control signal, an output terminal for outputting an output signal, a node control circuit, an output circuit, and a threshold voltage control circuit, the method comprising:
  setting, by the node control circuit, a potential at a first node under control of the input signal, the reset signal, and a potential at a second node;
  setting, by the node control circuit, the potential at the second node under control of the second clock signal and the potential at the first node;
  outputting, by the output circuit, the output signal at the output terminal under control of the first clock signal, the potential at the first node, the potential at the second node, and the reset signal, wherein the output circuit comprises a de-noising transistor comprising a gate connected to the second node, a drain connected to the output terminal, and a source; and
  setting, by the threshold voltage control circuit, a potential at the source of the de-noising transistor under control of the control signal and the potential at the second node to achieve a balance between a gate voltage and a source voltage of the de-noising transistor during a time interval.

17. The method of claim 16, wherein the setting the potential at the first node comprises:
  setting the potential at the first node to be active in response to the input signal being active; and
  setting the potential at the first node to be inactive in response to at least one of the reset signal or the potential at the second node being active.

18. The method of claim 16, wherein the setting the potential at the second node comprises:
  setting the potential at the second node to be active in response to the second clock signal being active; and
  setting the potential at the second node to be inactive in response to the potential at the first node being active.

19. The method of claim 16, wherein the outputting the output signal comprises:
  transferring the first clock signal to the output terminal in response to the potential at the first node being active;
  transferring the source voltage of the de-noising transistor to the output terminal in response to the reset signal being active; and
  transferring the source voltage of the de-noising transistor to the output terminal in response to the potential at the second node being active.

20. The method of claim 16, wherein the control terminal comprises a first control terminal and a second control terminal, and wherein the setting the potential at the source of the de-noising transistor comprises:
  bringing the gate of the de-noising transistor out of conduction with the source of the de-noising transistor in response to a signal received at the second control terminal being inactive;
  bringing the gate of the de-noising transistor into conduction with the source of the de-noising transistor during the time interval in response to the signal received at the second control terminal being active during the time interval;
  bringing a reference level terminal for supplying a reference voltage of the reference level terminal having an inactive level into conduction with the source of the de-noising transistor in response to a signal received at the first control terminal being active; and
  bringing the reference level terminal out of conduction with the source of the de-noising transistor in response to the signal received at the first control terminal being inactive during the time interval.

\* \* \* \* \*